US005345092A

United States Patent [19]

Kurihara

[11] Patent Number: 5,345,092
[45] Date of Patent: Sep. 6, 1994

[54] LIGHT EMITTING DIODE INCLUDING ACTIVE LAYER HAVING FIRST AND SECOND ACTIVE REGIONS

[75] Inventor: Haruki Kurihara, Tokyo, Japan

[73] Assignee: Kabushiki Kaisha Toshiba, Kawasaki, Japan

[21] Appl. No.: 133,281

[22] Filed: Oct. 7, 1993

Related U.S. Application Data

[63] Continuation of Ser. No. 821,052, Jan. 16, 1992, abandoned.

[30] Foreign Application Priority Data

Jan. 18, 1991 [JP] Japan ................................. 3-004567

[51] Int. Cl.$^5$ ............................................. H01L 33/00
[52] U.S. Cl. ............................................. 257/13; 257/96; 257/622; 372/46
[58] Field of Search ................ 257/13, 94, 96, 95, 257/623, 622; 372/45, 44, 43, 46

[56] References Cited

U.S. PATENT DOCUMENTS

| 4,661,960 | 4/1987 | Hirayama et al. | 372/45 |
| 4,675,710 | 6/1987 | Ishikawa et al. | 257/96 |
| 4,737,961 | 4/1988 | Mori et al. | 372/44 |
| 4,852,110 | 7/1989 | Fujii et al. | 372/44 |
| 5,111,469 | 5/1992 | Narui et al. | 372/45 |

FOREIGN PATENT DOCUMENTS

| 54-25184 | 2/1979 | Japan | 372/45 |
| 59-63788 | 4/1984 | Japan | 372/43 |
| 59-175782 | 10/1984 | Japan | 372/45 |
| 60-15984 | 1/1985 | Japan | 372/45 |
| 60-242692 | 12/1985 | Japan | 372/43 |
| 60-261184 | 12/1985 | Japan | 372/43 |
| 62-179187 | 8/1987 | Japan | 372/43 |
| 63-73691 | 4/1988 | Japan | 372/43 |
| 63-129687 | 6/1988 | Japan | 372/43 |
| 1-84771 | 3/1989 | Japan | 372/43 |
| 1-194378 | 8/1989 | Japan | 372/43 |
| 1-293686 | 11/1989 | Japan | 372/45 |
| 2-54592 | 2/1990 | Japan | 372/45 |
| 2-94588 | 4/1990 | Japan | 372/45 |

*Primary Examiner*—Rolf Hille
*Assistant Examiner*—Minhloan Tran
*Attorney, Agent, or Firm*—Finnegan, Henderson Farabow, Garrett & Dunner

[57] ABSTRACT

A light emitting diode comprises a semiconductor substrate of compound semiconductor, an active layer provided above the semiconductor substrate and including first and second active regions, the first active region being spaced apart from the second active region thereby controlling diffusion of an injected minority carrier in a radial direction, the first active region substantially operating as a light emitting region, and a window for emitting light generated at the first active region.

11 Claims, 2 Drawing Sheets

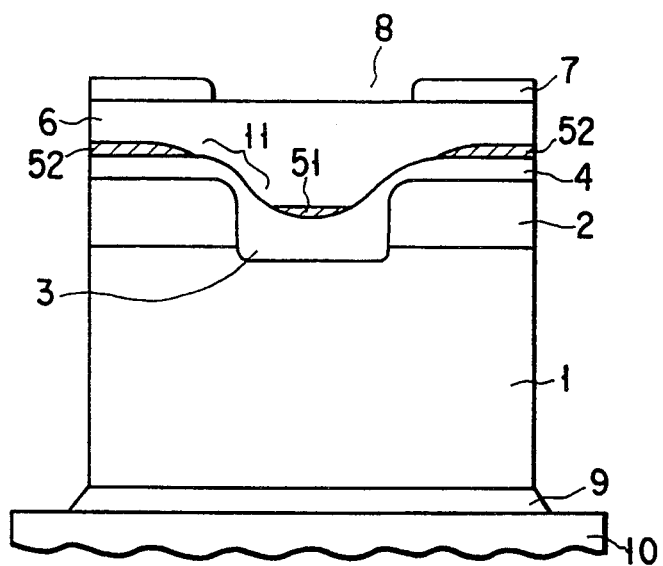
F I G. 1
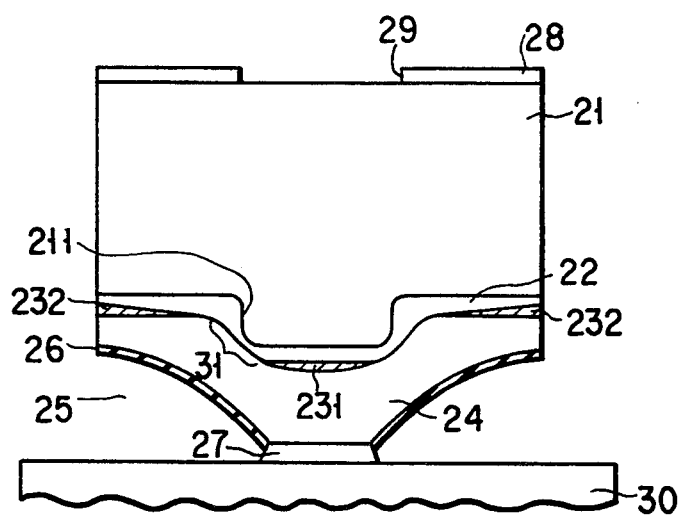
F I G. 2

5,345,092

LIGHT EMITTING DIODE INCLUDING ACTIVE LAYER HAVING FIRST AND SECOND ACTIVE REGIONS

This application is a continuation, of application Ser. No. 07/821,052, filed Jan. 16, 1992, now abandoned.

BACKGROUND OF THE INVENTION

1. Field of the Invention

The present invention relates to a light emitting diode for optical communication, and more particularly, to a light emitting diode having a high response.

2. Description of the Related Art

FIG. 3 is a sectional view showing a conventional light emitting diode used as a light emitting source of a transmission side in an optical communication system. The light emitting diode typically has the following structure.

(1) A light emitting layer 5 is sandwiched between clad layers 4 and 6 each having a refractive index smaller than that of the light emitting layer 5.

(2) The emitted light is extracted from one of the clad layers 4 and 6.

(3) A current injected into the light emitting layer is limited to an internal portion of a circular hole having a diameter of several tens $\mu$m.

The diode is actually provided as follows. Reference numeral 1 denotes a substrate of p-type GaAs crystal having a thickness of 100 [$\mu$m]; 2, a current blocking layer of n-type GaAs crystal having a thickness of 1.5 [$\mu$m]; 3, a circular hole formed in the current blocking layer and having a diameter of 40 [$\mu$m] and a depth of 2 [$\mu$m], respectively; 4, a first clad layer of p-type $Al_{0.25}Ga_{0.75}As$ crystal having a thickness of 2.5 [$\mu$m], in the circular hole; 5, a light emitting layer of p-type $Al_{0.05}Ga_{0.95}As$ crystal having a thickness of 0.3 [$\mu$m]; 6, a second clad layer of n-type $Al_{0.25}Ga_{0.75}As$ crystal having a thickness of 6 [$\mu$m]; 7, an n-side electrode metal layer having a thickness of 0.2 [$\mu$m] and being in oh/nic contact with the second clad layer; and 8, a circular window having a diameter of 90 [$\mu$m] and provided by removing the ohmic contact layer 7 at a position opposing to the circular hole 3. Reference numeral 9 denotes a p-side electrode metal layer provided on the opposite surface of the substrate and being in ohmic contact with the substrate. Reference numeral 10 denotes a heat sink coupled to the p-side electrode metal layer 9.

When the p-side electrode metal layer 9 is grounded, and a negative potential is applied to the n-side electrode metal layer 7, a pn junction between the current blocking layer 2 and the first clad layer 4 is reverse-biased. For this reason, a current flowing through the light emitting layer 5 is substantially limited just above the circular hole 3. Since the band gap of the semiconductor crystal in the two clad layers 4 and 6 is larger than that in the light emitting layer 5, the injected minority carrier generated by the current injection into the light emitting layer is confined in the light emitting layer. Since the injected minority carrier is three-dimensionally limited to increase a minority carrier concentration, a current modulation response of the light output can be increased. In addition, a light emitting region is restricted to the light emitting layer. As described above, since the light having the limited diameter is emitted from the window 8, high optical coupling to a lens or an optical fiber can be easily obtained.

Another conventional light emitting diode is shown in FIG. 4. This light emitting diode has the same structure as that of the conventional light emitting diode shown in FIG. 3 in the three items (1), (2), and (3) described above. However, unlike the first prior art, in the light emitting diode shown in FIG. 4, a different crystal is used, and a so-called mesa-shaped structure in which a light emitting layer is left in only a region opposing to a window is used. That is, reference numeral 21 denotes a substrate of n-type InP crystal having a thickness of 100 [$\mu$m]; 22, a buffer layer of n-type InP crystal having a thickness of 1.5 [$\mu$m]; 23, a light emitting layer of p-type $In_{0.47}Ga_{0.53}P$ crystal having a thickness of 0.8 [$\mu$m]; and 24, a clad layer of p-type InP crystal having a thickness of 4 [$\mu$m]. The substrate 21 and the buffer layer 22 act cooperatively as a first clad layer. A mesa portion 25 having a diameter of 30 [$\mu$m] is formed extending from the surface of the clad layer 24 to the substrate by etching. The side surface of the mesa portion 25 is covered with an insulating film 26 of $SiO_2$ having a thickness of 0.2 [$\mu$m] except the top of the mesa structure that serves as a current path. Reference numeral 27 denotes a p-side electrode metal layer being in ohmic contact with the second clad layer 24; 28, an n-side electrode metal layer being in ohmic contact with the substrate 21; 29, a window provided in the n-side electrode metal layer 28 at a position opposite to the current path; and 30, a heat sink fixed on the p-side electrode metal layer 27.

In the light emitting diode having the structure of the first prior art, however, since the heterojunction for confining the minority carrier in the light emitting region is not present in the radial direction, the minority carrier may be laterally diffused from the periphery of the light emitting region. Therefore, the carrier concentration is relatively low in the light emitting region. As a result, since the light emitting region is surrounded by the residual region having a width of several $\mu$m, which has the relatively low carrier concentration, that is, the long life time of the minority carrier, the response of the diode may be decreased. On the contrary, in the light emitting diode having the structure of the second prior art, since the dimension of the light emitting region in the radial direction is geometrically limited, the diffusion of minority carrier as described in the first prior art does not occur. Therefore, the response may not be decreased. However, since the side surface of the light emitting region including the pn junction is covered with the insulating film such as an oxide film with which the semiconductor crystals are not lattice-matched, the reliability of the diode is degraded.

SUMMARY OF THE INVENTION

It is, therefore, an object of the present invention to provide a light emitting diode for optical communication for reducing lateral diffusion of a minority carrier from a periphery of a light emitting region.

It is another object of the present invention to provide a light emitting diode for optical communication having a high response.

It is still another object to provide a light emitting diode for optical communication having high reliability.

According to an aspect of the present invention, there is provided a light emitting diode, which comprises a semiconductor substrate of compound semiconductor, an active layer provided above the semiconductor substrate and including first and second active regions, the first active region being spaced apart from the second active region through a constricted region, thereby controlling diffusion of an injected minority carrier in a radial direction, the first active region substantially operating as a light emitting region, and a window for emitting light generated at the first active region.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

FIG. 1 is a sectional view showing a light emitting diode for optical communication according to a first embodiment of the present invention;

FIG. 2 is a sectional view showing a light emitting diode for optical communication according to a second embodiment of the present invention;

DETAILED DESCRIPTION OF THE PREFERRED EMBODIMENTS

Figure 3:
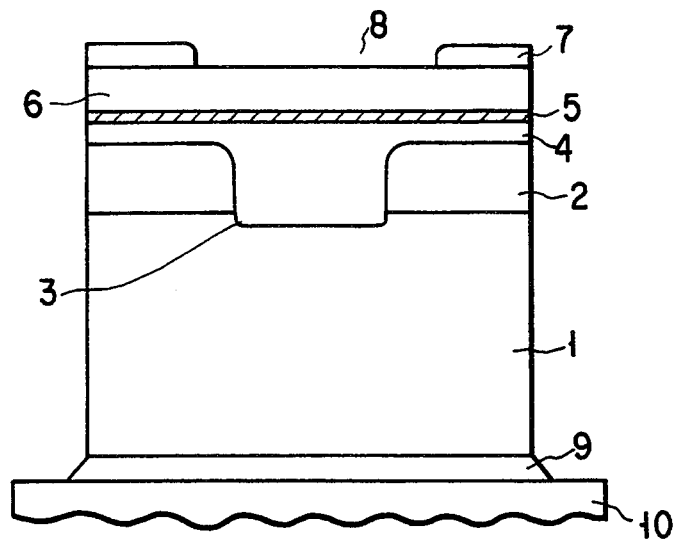
FIG. 3 is a sectional view showing a light emitting diode for optical communication according to a first prior art.

Embodiments of the present invention will be described below with reference to the accompanying drawings. The same reference numerals as in FIGS. 3 and 4 denote the same parts in FIGS. 1 and 2.

FIG. 1 is a sectional view showing a light emitting diode for optical communication according to the first embodiment of the present invention.

In the first embodiment, the present invention is applied to the light emitting diode for optical communication of the first prior art shown in FIG. 3.

A first active layer 51 substantially operating as a light emitting region is provided on a thick portion of a first clad layer 4 buried in the circular hole 3 of the current blocking layer 2. A second active layer 52 is provided on a thin portion of the first clad layer 4 formed on the current blocking layer 2. The first active layer 51 is spaced apart from the second active layer 52 by a constricted region 11 located in the upper periphery of the circular hole 3. As is apparent from FIG. 1, in the constricted region 11, any active layer is not present, and the first clad layer 4 and the second clad layer 6 are connected directly with each other to provide a pn junction.

The window 8 is provided by circularly removing the ohmic contact layer 7, and the constricted region 11 is arranged so as to correspond to the periphery of the window 8.

As described above, since the first active layer 51 is spaced apart from the second active layer 52, the first active layer 51 is substantially operated as the light emitting region, and the lateral diffusion of the minority carrier injected from the second clad layer 6 to the first active layer 51 can be suppressed.

In order to obtain the above structure, after the circular hole 3 is formed in the current blocking layer 2 grown on the substrate 1, the first clad layer 4, the active layer provided by the first and second active layers 51 and 52, the second clad layer 6, and the ohmic contact layer 7 are sequentially formed by liquid-phase epitaxial grow techniques. For epitaxially growing the active layer, the first clad layer 4 is grown to have the thickness smaller than that of the first prior art, and the supersaturation degree of the melt used for growing the active layer is reduced. Under the above epitaxial growth conditions, the active layer is separated into the first active layer 51 and the second active layer 52 through the constricted region 11 due to the circular hole 3 formed in the substrate 1 in advance, thereby obtaining the light emitting diode having the desired constricted region 11.

FIG. 2 is a sectional view showing a light emitting diode for optical communication according to the second embodiment of the present invention.

Figure 4:
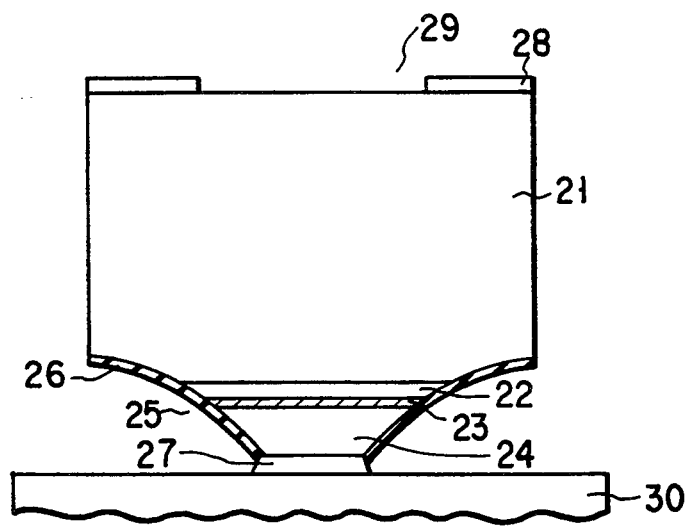
FIG. 4 is a sectional view showing a light emitting diode for optical communication according to a second prior art.

According to the second embodiment, the present invention is applied to the light emitting diode for optical communication of the second prior art shown in FIG. 4. In this embodiment, unlike the first embodiment, a first active layer 231 substantially operating as a light emitting region is arranged by forming a convex portion 211 on the substrate 21. That is, the first active layer 231 is provided on the top surface of the convex portion 211 through the buffer layer 22, and a second active layer 232 is formed on the periphery of the buffer layer 22. The first active layer 231 is spaced apart from the second active layer 232 by a constricted region 31. As is apparent from FIG. 2, no active layer is present at the constricted region 31, at which the buffer layer 22 and the clad layer 4 are direct connected to provide a pn Junction therebetween.

The first active layer 231 is spaced part from the second active layer 232 in the same manner as the first embodiment. Therefore, the first active layer 231 acts as the light emitting region, and the lateral diffusion of the minority carrier injected from the buffer layer 22 to the first active layer 231 can be suppressed. Since the pn junction which contributes to light emission is not covered with the insulating film, a highly reliable device can be obtained.

In order to obtain the above structure, after the convex portion 211 is formed on the substrate 21, the buffer layer 22, the active layer provided by the first and second active layers 231 and 232, and the clad layer 24 are sequentially formed by liquid-phase epitaxial growth techniques. During the liquid-phase epitaxial growth, the buffer layer 22 is grown to have a thickness smaller than that of the buffer layer of the second prior art, and the supersaturation degree of the melt used for growing the active layer is reduced. Therefore, as in the first embodiment, the desired constricted region 31 can be formed in the active layers.

In place of the liquid-phase epitaxial growth, metal organic chemical vapor deposition techniques may be used.

As described above, in the first and second embodiments, the response of the light emitting diode can be increased by 50% or more at a cutoff frequency without degradation of the reliability.

As described above, according to the present invention, since the constricted region is provided in the active layer formed above the surface of the substrate, the diffusion of minority carrier from the periphery of the light emitting region is suppressed without degradation of the reliability. Therefore, the light emitting diodes for optical communication having the high response can be provided. In addition, the periphery of the light emitting region is surrounded by the lattice-matched heterojunction, highly reliable light emitting diodes for optical communication can be obtained.

It is further understood by those skilled in the art that the foregoing description is only of the preferred embodiments and that various changes and modifications may be made in the invention without departing from, the spirit and scope of thereof.

What is claimed is:

1. A light emitting diode comprising:
   a semiconductor substrate of a first conductivity type;
   a current blocking layer of a second conductivity type provided on said semiconductor substrate;
   a recessed portion formed in said current blocking layer so as to extend to said semiconductor substrate;
   a first cladding layer of said first conductivity type including a first cladding region buried in said recessed portion, a second cladding region provided on said current blocking layer, and a constricted region located at a peripheral portion of and surrounding said recessed portion;
   an active layer of said first conductivity type including a first active region, provided on said first cladding region, substantially operating as a light emitting region, and a second active region provided on said second cladding region, said second active region being separated outward from said first active region by said constricted region;
   a second cladding layer of said second conductivity type provided over said active layer so as to cover said first cladding layer;
   an ohmic contact layer provided on said second cladding layer; and
   a window provided in said ohmic contact layer.

2. The light emitting diode according to claim 1, wherein said recessed portion is a circular hole.

3. The light emitting diode according to claim 1, wherein the constricted region is ring-shaped, the window has a ring-shaped periphery, and the ring-shaped periphery has a projection upon the recessed portion within said ring-shaped constricted region.

4. The light emitting diode according to claim 1, wherein said first cladding region is thicker than said second cladding region.

5. The light emitting diode according to claim 1, wherein each of said first and second cladding layers has a higher band gap than said active layer.

6. The light emitting diode according to claim 1, wherein said recessed portion has a ring-shaped peripheral portion and said constricted region is ring-shaped and provides a pn junction between said first and second cladding layers.

7. The light emitting diode of claim 1, wherein said second active region surrounds said first active region.

8. A light emitting diode comprising:
   a semiconductor substrate of a first conductivity type having a first surface, said semiconductor substrate including a projected portion having a second surface protruding from said first surface;
   a buffer layer of said first conductivity type, provided over said semiconductor substrate, including a first buffer region provided on said second surface, a second buffer region provided on said first surface, and a constricted region located at a peripheral portion of said projected portion;
   an active layer of a second conductivity type including a first active region, provided on said first buffer region, substantially operating as a light emitting region, and a second active region provided on said second buffer region, said second active region being separated outward from said first active region by said constricted region;
   a mesa-shaped cladding layer of said second conductivity type provided over said active layer so as to cover said buffer layer, said constricted region forming a pn junction between said buffer layer and said mesa-shaped cladding layer;
   an ohmic contact layer provided on an opposite surface of said semiconductor substrate; and
   a window provided in said ohmic contact layer.

9. The light emitting diode according to claim 8, wherein said second active region is substantially ring shaped and separated radially outward from said first active region.

10. The light emitting diode according to claim 8, wherein a periphery of said window is arranged within said constricted region.

11. The light emitting diode according to claim 8, wherein each of said buffer layer and said mesa-shaped cladding layers has a higher band gap than said active layer.

* * * * *